(12) United States Patent
Shibasaki et al.

(10) Patent No.: US 11,563,132 B2
(45) Date of Patent: Jan. 24, 2023

(54) SOLAR CELL, MULTI-JUNCTION SOLAR CELL, SOLAR CELL MODULE, AND PHOTOVOLTAIC SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Soichiro Shibasaki, Nerima Tokyo (JP); Mutsuki Yamazaki, Yokohama Kanagawa (JP); Kazushige Yamamoto, Yokohama Kanagawa (JP); Yuya Honishi, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 186 days.

(21) Appl. No.: 16/563,994

(22) Filed: Sep. 9, 2019

(65) Prior Publication Data

US 2020/0006583 A1    Jan. 2, 2020

Related U.S. Application Data

(63) Continuation of application No. PCT/JP2018/002789, filed on Jan. 29, 2018.

(51) Int. Cl.
*H01L 31/0445* (2014.01)
*H02S 40/38* (2014.01)
(Continued)

(52) U.S. Cl.
CPC .. *H01L 31/0445* (2014.12); *H01L 31/022475* (2013.01); *H01L 31/022483* (2013.01);
(Continued)

(58) Field of Classification Search
CPC .............. H01L 31/0725; H01L 31/072; H01L 31/02167; H01L 31/022425;
(Continued)

(56) References Cited

U.S. PATENT DOCUMENTS 6,258,702 B1    7/2001  Nakagawa et al.
2006/0226767 A1*  10/2006  Tyan ................... H01L 51/5265
                                                            313/504
(Continued)

FOREIGN PATENT DOCUMENTS

CN    103137717 A  *  6/2013
JP    62-073782          4/1987
(Continued)

OTHER PUBLICATIONS

Nordseth, Optical Analysis of a ZnO/Cu2O Subcell in a Silicon-Based Tandem Heterojunction Solar Cell, Green and Sustainable Chemistry, Feb. 2017, 7, 57-69 (Year: 2017).*

(Continued)

*Primary Examiner* — Devina Pillay
(74) *Attorney, Agent, or Firm* — Amin, Turocy & Watson, LLP

(57) ABSTRACT

A solar cell of an embodiment includes: a p-electrode in which a first p-electrode and a second p-electrode are laminated; a p-type light-absorbing layer in direct contact with the first p-electrode; an n-type layer in direct contact with the p-type light-absorbing layer; and an n-electrode. The first p-electrode is disposed between the p-type light-absorbing layer and the second p-electrode. The p-type light-absorbing layer is disposed between the n-type layer and the first p-electrode. The n-type layer is disposed between the p-type light-absorbing layer and the n-electrode. The first p-electrode includes a metal oxide containing Sn as a main component.

19 Claims, 9 Drawing Sheets

(51) Int. Cl.
*H01L 31/0224* (2006.01)
*H01L 31/032* (2006.01)
*H01L 31/0687* (2012.01)
*H01L 31/072* (2012.01)
*H01L 31/0725* (2012.01)

(52) U.S. Cl.
CPC ........ *H01L 31/032* (2013.01); *H01L 31/0687* (2013.01); *H01L 31/072* (2013.01); *H01L 31/0725* (2013.01); *H02S 40/38* (2014.12)

(58) Field of Classification Search
CPC . H01L 31/0322; H01L 31/075; H01L 31/043; H01L 31/0336; H01L 31/046; H01L 31/032; H01L 25/043; Y02E 10/548; Y02E 10/541
See application file for complete search history.

(56) References Cited

U.S. PATENT DOCUMENTS

| | | | |
|---|---|---|---|
| 2009/0087939 | A1 | 4/2009 | Lee |
| 2009/0194157 | A1* | 8/2009 | den Boer ............ H01L 31/0236 136/256 |
| 2011/0048493 | A1 | 3/2011 | Yun et al. |
| 2011/0303281 | A1 | 12/2011 | Kodama |
| 2012/0042945 | A1 | 2/2012 | Ji et al. |
| 2012/0097227 | A1 | 4/2012 | Lim et al. |
| 2013/0192656 | A1 | 8/2013 | Hardin et al. |
| 2014/0009514 | A1 | 1/2014 | Abe et al. |
| 2015/0031163 | A1 | 1/2015 | Lucas et al. |
| 2019/0198697 | A1 | 6/2019 | Honishi et al. |

FOREIGN PATENT DOCUMENTS

| | | |
|---|---|---|
| JP | 62-093804 | 4/1987 |
| JP | 2000-228516 | 8/2000 |
| JP | 2001-015785 | 1/2001 |
| JP | 2001-202820 | 7/2001 |
| JP | 2003-258278 | 9/2003 |
| JP | 2003-282897 | 10/2003 |
| JP | 3616824 | 2/2005 |
| JP | 2005-239526 | 9/2005 |
| JP | 2006-009083 | 1/2006 |
| JP | 2006-124753 | 5/2006 |
| JP | 2006-124754 | 5/2006 |
| JP | 2006124754 A * | 5/2006 |
| JP | 2006332373 A * | 12/2006 |
| JP | 2011-054971 | 3/2011 |
| JP | 2012-142539 | 7/2012 |
| JP | 2012-186415 | 9/2012 |
| JP | 2014-170865 | 9/2014 |
| JP | 2014-183244 | 9/2014 |
| JP | 2016-192554 | 11/2016 |
| JP | 2017-059656 | 3/2017 |
| JP | 2017059656 A * | 3/2017 |
| JP | 2017-098479 | 6/2017 |
| JP | 2019-057536 | 4/2019 |
| JP | 2019-057701 | 4/2019 |
| WO | 2010/098293 | 9/2010 |
| WO | 2019/058604 | 3/2019 |

OTHER PUBLICATIONS

JP-2006332373-A, Machine Translation (Year: 2006).*
JP-2017059656-A, Machine Translation, Mar. 2017 (Year: 2017).*
JP2006124754A, Machine Translation (Year: 2006).*
CN 103137717 A, He, Machine Translation (Year: 2013).*
Non-Final Office Action for U.S. Appl. No. 16/289,711 dated Nov. 16, 2020.
Final Office Action for U.S. Appl. No. 16/289,711 dated Mar. 1, 2021.
International Search Report and Written Opinion for International Application No. PCT/JP2018/002789 dated Apr. 10, 2018, 8 pgs.
Baek, et al. "Binary Oxide p-n Heterojunction Piezoelectric Nanogenerators with an Electrochemically Deposited High p-Type Cu2O Layer", pp. 22135-22141, Applied Materials & Interfaces, 8, 2016.
Wang, et al. "Fabrication and Characterization of p-n Homojunctions in Cuprous Oxide by Electrochemical Deposition", H248-H250, Electrochemical and Solid-State Letters, 10, 2007.
Han, et al. "Electrochemically deposited p-n homojunction cuprous oxide solar cells", pp. 153-157, Solar Energy Materials & Solar Cells, 93, 2009.
Minami, et al. "Cu2O-based solar cells using oxide semiconductors", 014002, Journal of Semiconductors, vol. 37, 2016.
Minami, et al. "Efficiency enhancement using a $Zn_{1-x}Ge_{x}$-1 thin film as an n-type window layer in Cu2O-based heterojunction solar cells", 052301, Applied Physics Express 9, 2016.
Kaur, et al. "Localized surface plasmon induced enhancement of electron-hole generation with silver metal island at n-Al:ZnO/p-Cu2O heterojunction", 053901, Applied Phisics Letters 107, 2015.
Lee, et al. "Atomic Layer Deposited Gallium Oxide Buffer Layer Enables 1.2 V Open-Circuit Voltage in Cuprous Oxide Solar Cells", pp. 4704-4710, Advanced Materials, 2014.
Minami, et al. "High-efficiency solar cells fabricated using oxide semiconductors", Applied Physics, vol. 86, No. 8 (2017).
Nishi "A Study of High-Efficiency Heterojunction Solar Cells Using a Cu2O Sheets as p-type Oxide semiconductor Layer", Kenjiro Takayanagi Foundation, Jan. 2017.
Septina, et al. "Potentiostatic electrodeposition of cuprous oxide thin films for photovoltaic applications", Electrochemica Acta 56, (2011) pp. 4882-4888.
Jayakrishnan, "Negative resistance in Cu2O/In2S3 heterostructure" Materials Chemistry and Physics, vol. 162 (2015) pp. 542-pp. 547.

* cited by examiner

SOLAR CELL, MULTI-JUNCTION SOLAR CELL, SOLAR CELL MODULE, AND PHOTOVOLTAIC SYSTEM

CROSS-REFERENCE TO RELATED APPLICATION

This application is a continuation application based upon and claims the benefit of priority from International Application PCT/JP2018/002789, the International Filing Date of which is Jan. 29, 2018 the entire contents of which are incorporated herein by reference.

FIELD

Embodiments described herein relate generally to a solar cell, a multi-junction solar cell, a solar cell module, and a photovoltaic system.

BACKGROUND

One of the new solar cells is a cuprous oxide ($Cu_2O$) solar cell. $Cu_2O$ is a wide-gap semiconductor with a band gap of 2.1 eV. Since $Cu_2O$ is a safe, inexpensive material consisting of copper and oxygen abundantly present on the earth, it is expected to be able to realize a highly-efficient, low-cost solar cell.

FIGS. 1A and 1B show sectional views of a conventional $Cu_2O$ solar cell. There are two types of $Cu_2O$ solar cell, i.e., a thick film type (FIG. 1A) and a thin film type (FIG. 1B), depending on the method of producing the light-absorbing layer.

The thick film type $Cu_2O$ solar cell is an element formed by thermally oxidizing, in an electric furnace, a copper foil having a thickness of approximately equal to or more than 0.1 mm and equal to or less than 0.2 mm to prepare a $Cu_2O$ thick film sheet, sequentially laminating an n-type layer and a transparent electrode (light-transmissive n-electrode) on one side, and forming an optically opaque Au electrode (impermeable p-electrode) on the other side. On the other hand, the thin film type $Cu_2O$ solar cell is an element formed by forming an Au electrode (p-electrode) on a glass substrate, and then sequentially forming a $Cu_2O$ thin film (p-layer) having a thickness of approximately equal to or more than 1 μm and equal to or less than 5 μm, an n-type layer, and a transparent electrode.

As shown in FIGS. 1A and 1B, in the conventional $Cu_2O$ solar cell, an expensive Au electrode is used for the p-electrode in both the thick film type and the thin film type, and it becomes a problem that the p-electrode is expensive when producing a large-area solar cell.

DETAILED DESCRIPTION

A solar cell of an embodiment includes: a p-electrode in which a first p-electrode and a second p-electrode are laminated; a p-type light-absorbing layer in direct contact with the first p-electrode; an n-type layer in direct contact with the p-type light-absorbing layer; and an n-electrode The first p-electrode is disposed between the p-type light-absorbing layer and the second p-electrode. The p-type light-absorbing layer is disposed between the n-type layer and the first p-electrode. The n-type layer is disposed between the p-type light-absorbing layer and the n-electrode. The first p-electrode includes a metal oxide containing Sn as a main component.

Hereinafter, an embodiment of the present invention will be described in detail with reference to the drawings.

First Embodiment

Figure 1A:
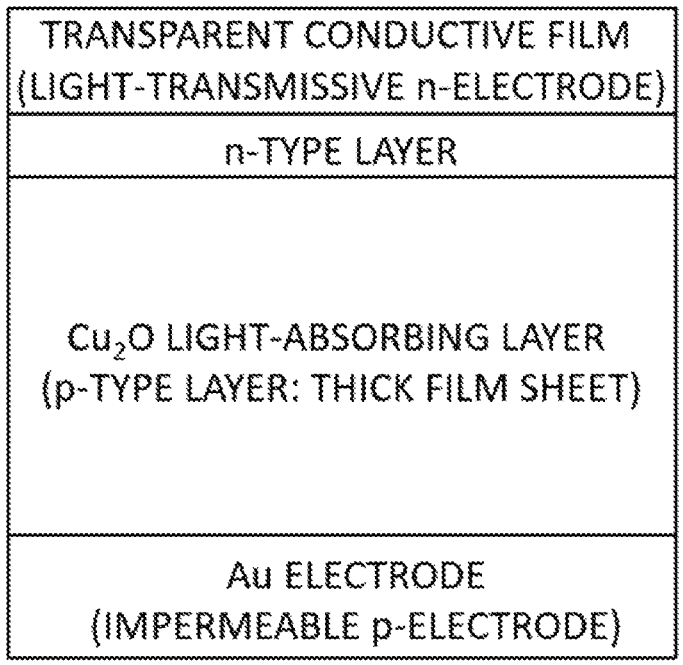
FIG. 1A shows a sectional view of a thick film type cuprous oxide solar cell.
Figure 1B:
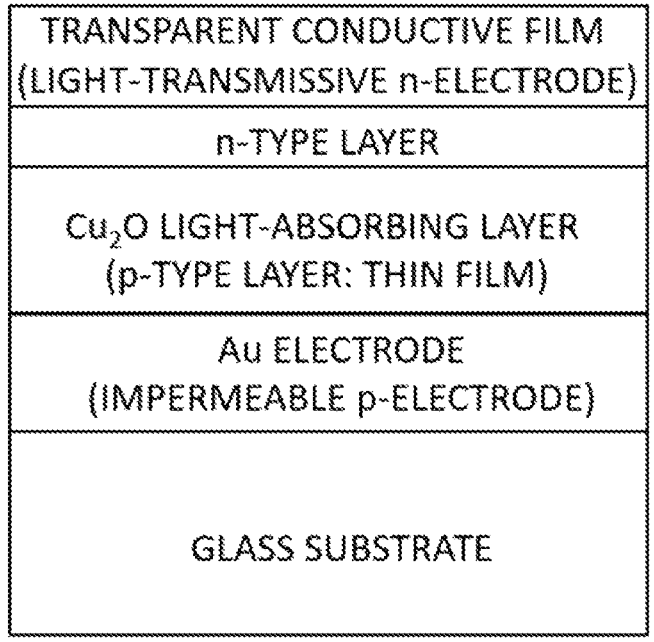
FIG. 1B shows a sectional view of a thin film type cuprous oxide solar cell.
Figure 2:
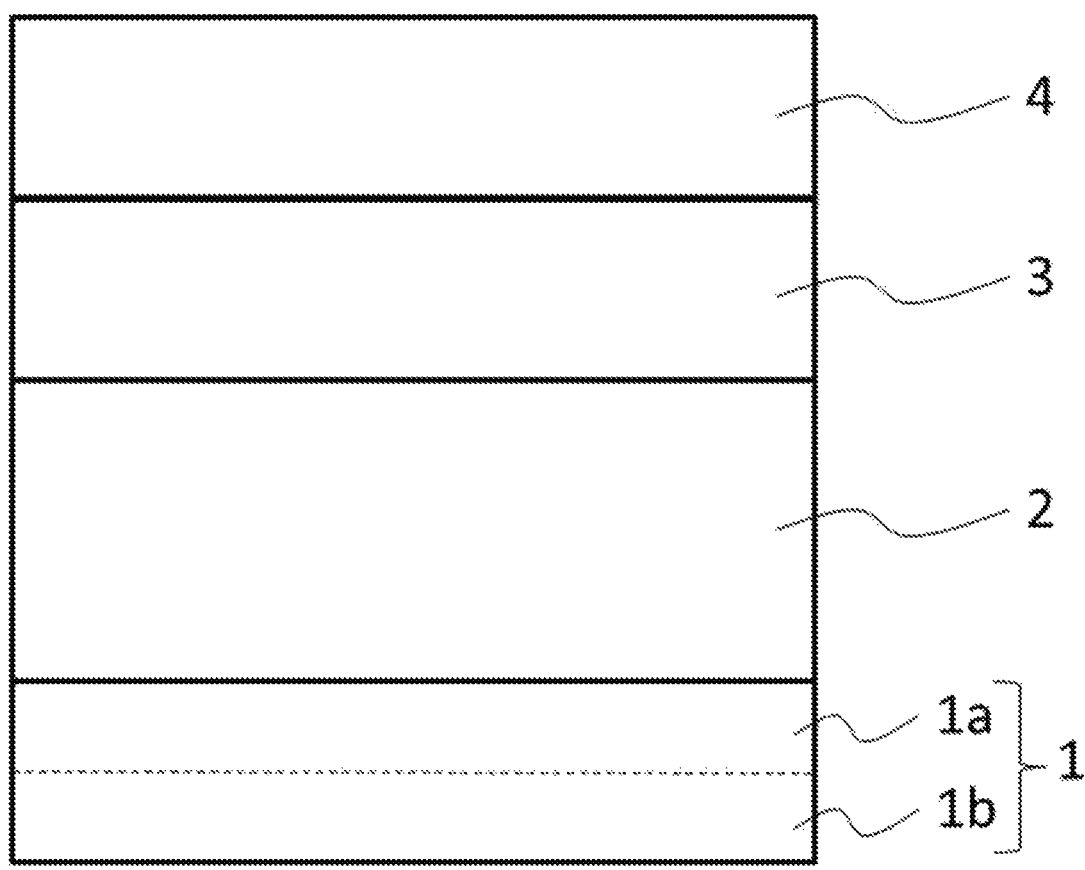
FIG. 2 shows a sectional view of the solar cell of an embodiment.

A first embodiment relates to a solar cell. FIG. 2 shows a sectional view of a solar cell 100 of the first embodiment. As shown in FIG. 2, the solar cell 100 according to the present embodiment has a p-electrode 1, a p-type light-absorbing layer 2, an n-type layer 3, and an n-electrode 4. An intermediate layer not illustrated may be included between the n-type layer 3 and the n-electrode 4 or the like. While sunlight may enter from either of the n-electrode 4 side and the p-electrode 1 side, it is more preferable to enter from the n-electrode 4 side. A substrate not illustrated may be provided on the p-electrode 1 side or the n-electrode 4 side.

The p-electrode 1 is an electrode in direct contact with the p-type light-absorbing layer 2. The p-electrode 1 includes a first p-electrode 1a and a second p-electrode 2b. The first p-electrode 1a and the second p-electrode 1b are laminated. The first p-electrode is disposed more on the p-type light-absorbing layer 2 side than the second p-electrode 1b.

The first p-electrode 1a is an oxide film including a metal oxide containing Sn as a main component. The first p-electrode 1a is an electrode in direct contact with the p-type light-absorbing layer 2. The first p-electrode 1a is disposed between the second p-electrode 1b and the p-type light-absorbing layer 2. The reason why the p-electrode 1 is preferably a laminated film is that the resistivity of the metal oxide containing Sn as a main component is higher than that of a metal film, an intermetallic compound film, and an oxide transparent conductive film such as indium tin oxide (ITO), and when the p-electrode 1 is used as a single electrode, it causes power generation loss due to a resistance component.

A metal film such as Au or an oxide transparent conductive film such as ITO has been used as an electrode in direct contact with the p-type light-absorbing layer 2. It is known that when a metal film such as Au is used as a p-electrode in direct contact with the p-type light-absorbing layer 2, the interface between the p-type light-absorbing layer and the p-electrode becomes an ohmic contact with respect to a hole. An ohmic contact has a problem of cost because Au is expensive in spite of low resistance. It is also known that when a transparent conductive film such as indium tin oxide is used as a p-electrode in direct contact with the p-type light-absorbing layer 2, a Schottky barrier is formed at the interface between the transparent conductive film and the p-type light-absorbing layer 2, and the conversion efficiency becomes low because the contact resistance between the p-electrode and the light-absorbing layer 2 is high.

Figure 3:
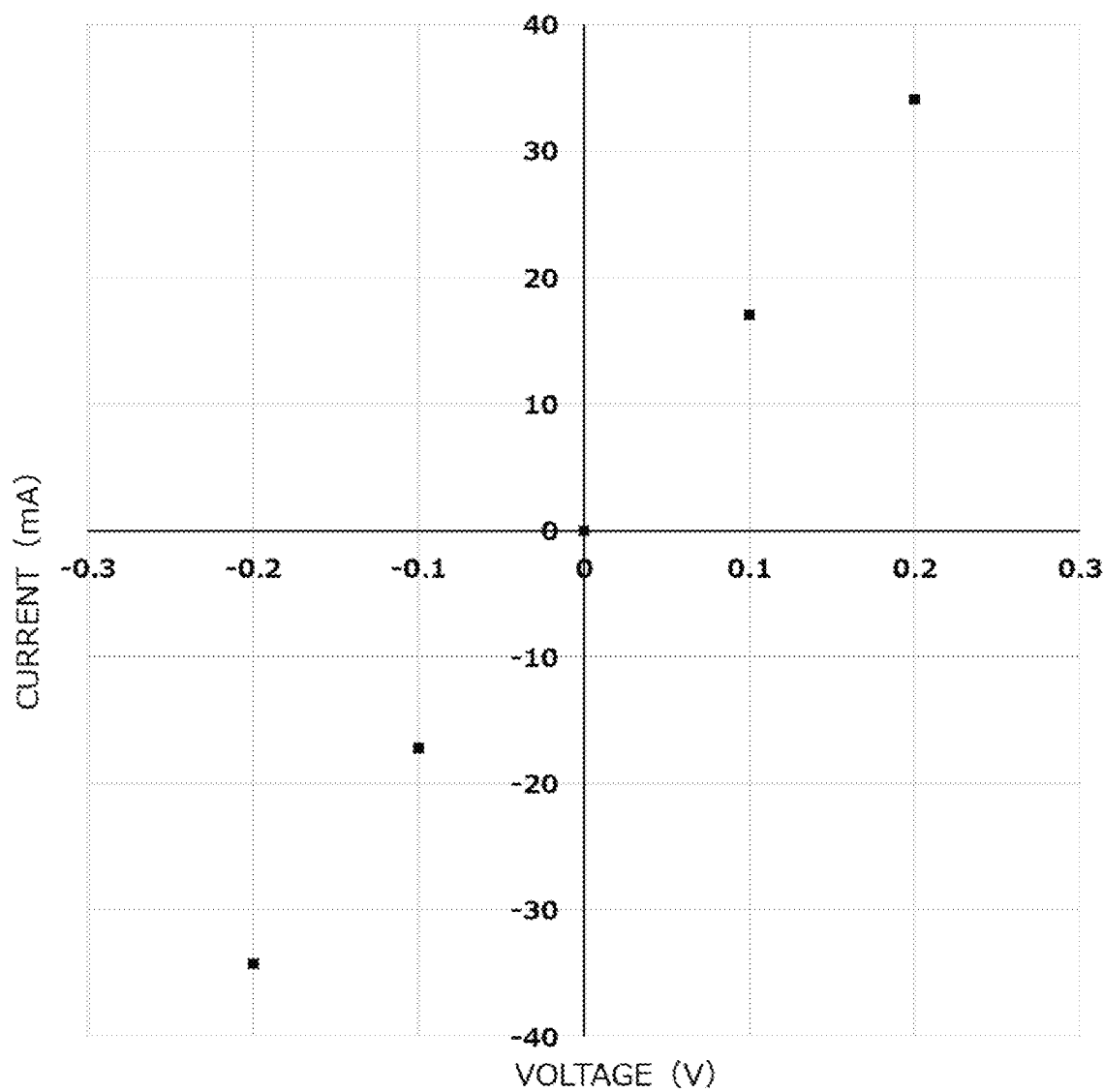
FIG. 3 shows a current-voltage characteristic of a glass/Au/$Cu_2O$/Au element.

The contact between the Au electrode and the p-type light-absorbing layer 2 will be described more specifically. FIG. 3 shows a current-voltage characteristic of a glass/Au/Cu$_2$O/Au element in which an Au electrode is formed on a glass substrate, and a Cu$_2$O thin film light-absorbing layer (p-type light-absorbing layer) and an opposing Au electrode are sequentially formed on the Au electrode. The figure indicates that an ohmic current flows with respect to the voltage in this element. The Au/Cu$_2$O interface is known empirically to be an ohmic contact to a hole, which is justified by the result of FIG. 3.

Figure 4:
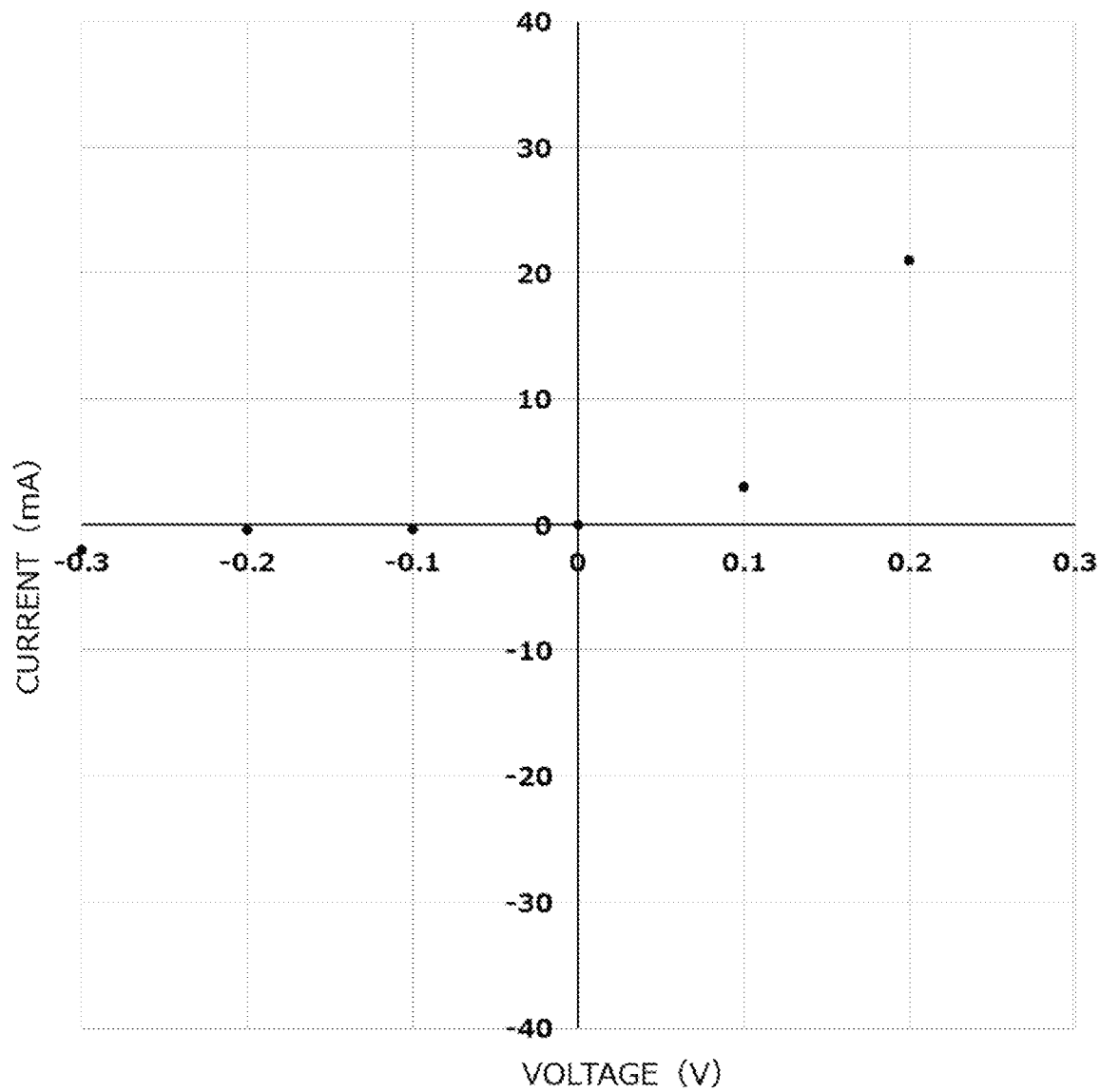
FIG. 4 shows a current-voltage characteristic of a glass/ITO/$Cu_2O$/Au element.

The contact between the ITO electrode and the p-type light-absorbing layer 2 will be described more specifically. ITO contains Sn, but In is the main component of metal. FIG. 4 shows a current-voltage characteristic of a glass/ITO/Cu$_2$O/Au element in which an ITO electrode is formed on a glass substrate, and a Cu$_2$O thin film light-absorbing layer (p-type light-absorbing layer) and an opposing Au electrode are sequentially formed on the ITO electrode. The figure indicates that this element exhibits rectification with respect to voltage and diode current flows. As the Au/Cu$_2$O interface is known empirically to be an ohmic contact to a hole, the result of FIG. 4 indicates that the ITO/Cu$_2$O interface forms a Schottky barrier.

Figure 5:
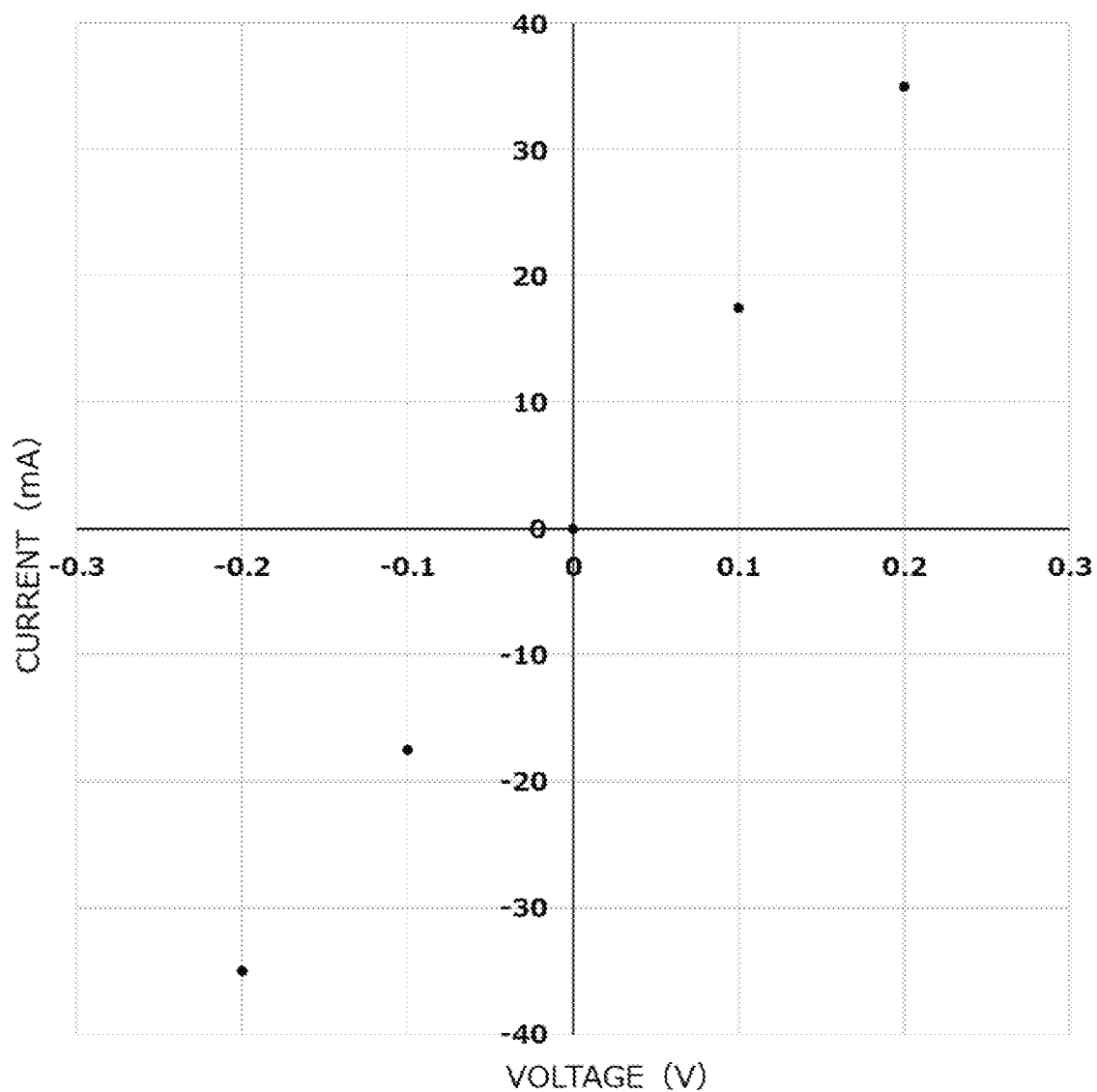
FIG. 5 shows a current-voltage characteristic of a glass/$SnO_2$/$Cu_2O$/Au element.

The contact between the SnO$_2$ electrode and the p-type light-absorbing layer 2 will be described more specifically. FIG. 5 shows a current-voltage characteristic of a glass/SnO$_2$/Cu$_2$O/Au element in which a Cu$_2$O thin film light-absorbing layer is formed on conductive SnO$_2$ (antimony Sb addition), and Au is formed as an opposing electrode on the Cu$_2$O thin film light-absorbing layer. The figure indicates that the ohmic current flows with respect to voltage also in this element. Since the Au/Cu$_2$O interface is an ohmic contact to a hole, the result of FIG. 5 indicates that the SnO$_2$/Cu$_2$O interface is also an ohmic contact to a hole.

As shown in the results of FIGS. 3, 4, and 5, the p-electrode 1 in direct contact with the p-type light-absorbing layer 2, i.e., the first p-electrode 1a, is preferably a metal oxide containing Sn as a main component. Such results are unexpected for the following reason. The conductivity type of a metal oxide containing Sn as a main component is an n-type semiconductor similar to ITO and the like. SnO$_2$ (metal oxide containing Sn as a main component) of n-type having relatively low conductivity was considered to be inappropriate as a p-electrode in direct contact with the p-type light-absorbing layer. It has turned out that SnO$_2$ (metal oxide containing Sn as a main component) is expected to form a Schottky barrier similarly to ITO, but the result is different from the expectation. It is not clear why the metal oxide containing Sn as a main component is in ohmic contact with the p-type light-absorbing layer 2. There is a possibility that the metal oxide and the p-type light-absorbing layer 2 are in tunnel junction.

Furthermore, SnO$_2$ has conductivity but SnO$_2$ itself is a low conductive material. However, comparison between FIG. 3 and FIG. 5 indicates that the element using the SnO$_2$ electrode exhibits the same current-voltage characteristic as the element using the Au electrode does. This result is also unexpected from the characteristics of SnO$_2$.

The metal contained in the oxide of the first p-electrode 1a may include one or more types of metal selected from the group consisting of Zn, Al, Ga, In, Si, Ge, Ti, Cu, Sb, Nb, F, and Ta in addition to Sn. These metals other than Sn are doped in tin oxide. For example, by increasing Sb, carriers are increased, and the first p-electrode 1a and the p-type light-absorbing layer 2 become liable to be in tunnel junction. Cu contained in the p-type light-absorbing layer 2 may be contained in the first p-electrode 1a. Based on these, among the above metals, Cu, Sb, or Cu and Sb are preferable in addition to Sn as a metal contained in the first p-electrode 1a. Accordingly, the metal of the oxide of the first p-electrode 1a is preferably Sn and Sb, Sn and Cu, or Sn, Sb, and Cu. The first p-electrode 1a may be an oxide transparent conductive film substantially not containing one or more types of metal selected from the group consisting of Zn, Al, Ga, In, Si, Ge, Ti, Cu, Sb, Nb, F, and Ta in addition to Sn, i.e., an oxide transparent conductive film in which 99 atom % or more of the metal contained in the oxide is Sn.

It is preferable that 90 atom % or more of the metal contained in the oxide of the first p-electrode 1a is Sn. If the Sn concentration in the first p-electrode 1a is low, the p-type light-absorbing layer 2 and the Schottky barrier are liable to be formed as ITO. From the same viewpoint, it is more preferable that 95 atom % or more of the metal contained in the oxide of the first p-electrode 1a is Sn. From the same viewpoint, the concentration of Sn contained in the first p-electrode 1a is preferably equal to or more than 29.5 atom % and equal to or less than 33.5%. More preferably, 95 atom % or more of the metal contained in the oxide of the first p-electrode 1a is Sn and 5 atom % or more is one or more types of metal selected from the group consisting of Zn, Al, Ga, In, Si, Ge, Ti, Cu, Sb, Nb, F, and Ta. More preferably, 95 atom % or more of the metal contained in the oxide of the first p-electrode 1a is Sn, and equal to or more than 0.1 atom % and equal to or less than 5 atom % is Cu, Sb, or Cu and Sb.

The thickness of the first p-electrode 1a is determined by cross-sectional observation with an electron microscope or by a step profiler, and is preferably equal to or more than 1 nm and equal to or less than 1000 nm. If the first p-electrode 1a is too thin, the p-type light-absorbing layer 2 is liable to be in direct contact with the second p-electrode 1b. If the first p-electrode 1a is too thick, the resistance of the p-electrode 1 becomes large, which is not preferable. The above range is preferable from the viewpoint of direct contact between the entire surface of the first p-electrode 1a facing the p-type light-absorbing layer 2 and the entire surface of the p-type light-absorbing layer 2 facing the first p-electrode 1a. From the same viewpoint, the thickness of the first p-electrode 1a is preferably equal to or more than 5 nm and equal to or less than 300 nm.

The second p-electrode 1b is a conductive film having a lower resistance than the first p-electrode 1a. The second p-electrode 1b is an electrode in direct contact with the first p-electrode 1a but not in direct contact with the p-type light-absorbing layer 2. The second p-electrode 1b is preferably a monolayer film or a laminated film selected from the group consisting of a metal film, an intermetallic compound film, and an oxide transparent conductive film. The laminated film includes a form in which different types of films are laminated such as a combination of a metal film and an oxide transparent conductive film, and a form in which the same type of films are laminated such as a combination of a metal film and a metal film. If the solar cell is a multi-junction solar cell or a translucent solar cell, both the p-electrode 1 and the n-electrode 4 preferably have a light-transmissive property with respect to visible light. From the viewpoint of the light-transmissive property of visible light, the second p-electrode 1b is preferably an oxide transparent conductive film.

The metal film used for the second p-electrode 1b is preferably one or more types of metal film selected from the group consisting of Cu, Al, Ag, Mo, W, and Ta. The intermetallic compound used for the second p-electrode 1b is preferably a film of intermetallic compound containing one or more types of metal listed for the metal film. The oxide transparent conductive film used for the second p-electrode 1b is preferably one or more types of film selected from the group consisting of indium tin oxide, aluminum-doped zinc oxide (AZO), boron-doped zinc oxide (BZO), gallium-doped zinc oxide (GZO), indium-doped zinc oxide (IZO), aluminum gallium oxide (AGO), titanium-doped indium oxide (ITiO), indium gallium zinc oxide (IGZO), and hydrogen-doped indium oxide ($In_2O_3$). The total concentration of Sn and Sb in the metal contained in the second p-electrode 1b is preferably equal to or less than 10 atom %.

The thickness of the second p-electrode 1b is determined by cross-sectional observation with an electron microscope or by a step profiler, and, although not particularly limited, it is typically equal to or more than 1 nm and equal to or less than 1 µm.

The first p-electrode 1a and the second p-electrode 1b are preferably formed by sputtering, for example.

Figure 6:
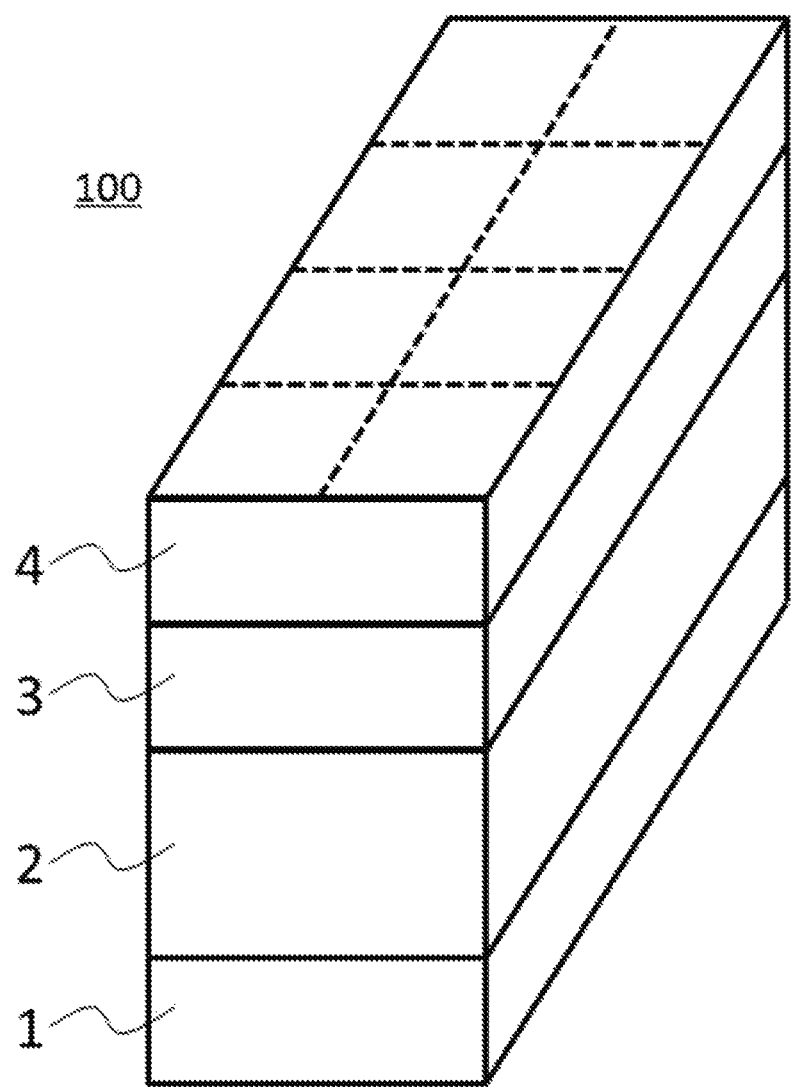
FIG. 6 shows a sectional view of the solar cell of the embodiment.

The element compositions in the first p-electrode 1a and the second p-electrode 1b can be confirmed by carrying out an analysis by secondary ion mass spectrometry (SIMS). An analysis in the depth direction from the n-type layer 3 towards the light-absorbing layer 2 is performed by SIMS. Elements contained in the p-electrode 1 are preferably measured in advance with a cross-section of the solar cell by transmission electron microscope—energy dispersive X-ray spectroscopy (TEM EDX). As shown in the perspective view of FIG. 6, the analysis position is a region of 78 µm×78 µm in the center of eight regions formed by dividing the main surface (surface opposite to the surface facing the n-type layer side) of the n-electrode 4 into four equal parts in the lengthwise direction and two equal parts in the widthwise direction. The p-type light-absorbing layer 2, the n-type layer 3, and the n-electrode 4 can also be analyzed by the same manner.

The p-type light-absorbing layer 2 is a p-type semiconductor layer. The p-type light-absorbing layer 2 is disposed between the first p-electrode 1a and the n-type layer 3. The p-type light-absorbing layer 2 is a semiconductor layer of a metal oxide containing Cu as a main component. The metal oxide containing Cu as a main component is cuprous oxide or a composite oxide of cuprous oxide. In the metal oxide containing Cu as a main component, Cu accounts for equal to or more than 60.0 atom % and equal to or less than 67.0 atom % and O (oxygen) accounts for equal to or more than 32.5 atom % and equal to or less than 34.0 atom %. The composite oxide of cuprous oxide contains a metal other than Cu. The metal contained in the composite oxide of cuprous oxide is, in addition to Cu, one or more types of metal selected from the group consisting of Sn, Sb, Ag, Li, Na, K, Cs, Rb, Al, Ga, In, Zn, Mg, and Ca. If one or more types of metal selected from the group consisting of Ag, Li, Na, K, Cs, Rb, Al, Ga, In, Zn, Mg, and Ca are contained in addition to Cu, the band gap of the p-type light-absorbing layer 2 can be adjusted. The band gap of the p-type light-absorbing layer 2 is preferably equal to or more than 2.0 eV and equal to or less than 2.2 eV. With a band gap having such range, in a multi-junction solar cell in which a solar cell using Si for the light-absorbing layer is used as a bottom cell and the solar cell of the embodiment is used as a top cell, sunlight can be efficiently utilized in both the top cell and the bottom cell. The p-type light-absorbing layer 2 may further contain Sn or Sb. Sn or Sb in the p-type light-absorbing layer 2 may be added to the light-absorbing layer 2 or may be derived from the p-electrode 1. The p-type light-absorbing layer 2 is an oxide layer represented by $Cu_aM_bO_c$. M is one or more types of metal selected from the group consisting of Sn, Sb, Ag, Li, Na, K, Cs, Rb, Al, Ga, In, Zn, Mg, and Ca. It is preferable that a, b, and c satisfy $1.80 \leq a \leq 2.01$, $0.00 \leq b \leq 0.20$, and $0.98 \leq c \leq 1.02$. The composition ratio of the p-type light-absorbing layer 2 is the entire composition ratio of the p-type light-absorbing layer 2. It is preferable that the compound composition ratio of the p-type light-absorbing layer 2 is satisfied entirely in the p-type light-absorbing layer 2. If the concentration of Sn and Sb in the p-type light-absorbing layer is high, defects increase and carrier recombination increases. Therefore, the total volume concentration of Sb and Sn in the p-type light-absorbing layer 2 is preferably equal to or less than $1.5 \times 10^{19}$ atoms/cm$^3$.

The thickness of the p-type light-absorbing layer 2 is determined by cross-sectional observation with an electron microscope or by a step profiler, and is preferably equal to or more than 1,000 nm and equal to or less than 10,000 nm.

The p-type light-absorbing layer 2 is preferably formed by sputtering, for example.

The n-type layer 3 is an n-type semiconductor layer. The n-type layer 3 is disposed between the p-type light-absorbing layer 2 and the n-electrode 4. The n-type layer 3 is in direct contact with the surface of the p-type light-absorbing layer 2 opposite to the surface in contact with the first p-electrode 1a. The n-type layer 3 is preferably a layer containing an oxide layer or a sulfide layer. More specifically, the oxide layer used for the n-type layer 3 is preferably a layer selected from the group consisting of $Zn_{(1-x)}A_xO_y$ (A=Si, Ge, Sn), $Cu_{(2-x)}M_xO$ (M=Mn, Mg, Ca, Zn, Sr, Ba), and $Al_{(2-x)}Ga_xO_3$. The sulfide layer used for the n-type layer is preferably a layer including one or more types of sulfide selected from the group consisting of $Zn_xIn_{(2-2x)}S_{(3-2x)}$, ZnS, and $In_xGa_{(1-x)}S$. When $Zn_{(1-x)}A_xO_y$ is used for the n-type layer, the Zn/A composition ratio is preferably in the range of 0.25 to 8, more preferably 1.5 to 6, more preferably 1 to 3, and more preferably in the range of 1.5 to 2.5.

The thickness of the n-type layer 3 is preferably equal to or more than 5 nm and equal to or less than 100 nm. If the thickness of the n-type layer 3 is equal to or less than 5 nm, leakage current is generated when the coverage of the n-type layer 3 is poor, which is not preferable. If the thickness of the n-type layer 3 exceeds 100 nm, the transmittance decreases and the short-circuit current decreases, which are not preferable. Accordingly, the thickness of the n-type layer 3 is more preferably equal to or more than 10 nm and equal to or less than 50 nm. In order to realize a film with good coverage, the surface roughness of the n-type layer 3 is preferably equal to or less than 5 nm.

The n-type layer 3 is preferably formed by sputtering, for example.

The n-electrode 4 is an electrode on the n-type layer 3 side having a light-transmissive property with respect to visible light. The n-type layer 3 is sandwiched by the n-type electrode 4 and the p-type light-absorbing layer 2. An intermediate layer not illustrated can be provided between the n-type layer 3 and the n-electrode 4. It is preferable to use an oxide transparent conductive film for the n-electrode 4. The oxide transparent conductive film used for the n-electrode 4 is preferably one or more types of transparent conductive film selected from the group consisting of indium tin oxide, aluminum-doped zinc oxide, boron-doped zinc oxide, gallium-doped zinc oxide, indium-doped zinc oxide, aluminum gallium oxide, titanium-doped indium oxide, indium gallium zinc oxide, and hydrogen-doped indium oxide.

The thickness of the n-electrode 4 is determined by cross-sectional observation with an electron microscope or by a step profiler, and, although not particularly limited, it is typically equal to or more than 1 nm and equal to or less than 2 μm.

The n-electrode 4 is preferably formed by sputtering, for example.

Second Embodiment

Figure 7:
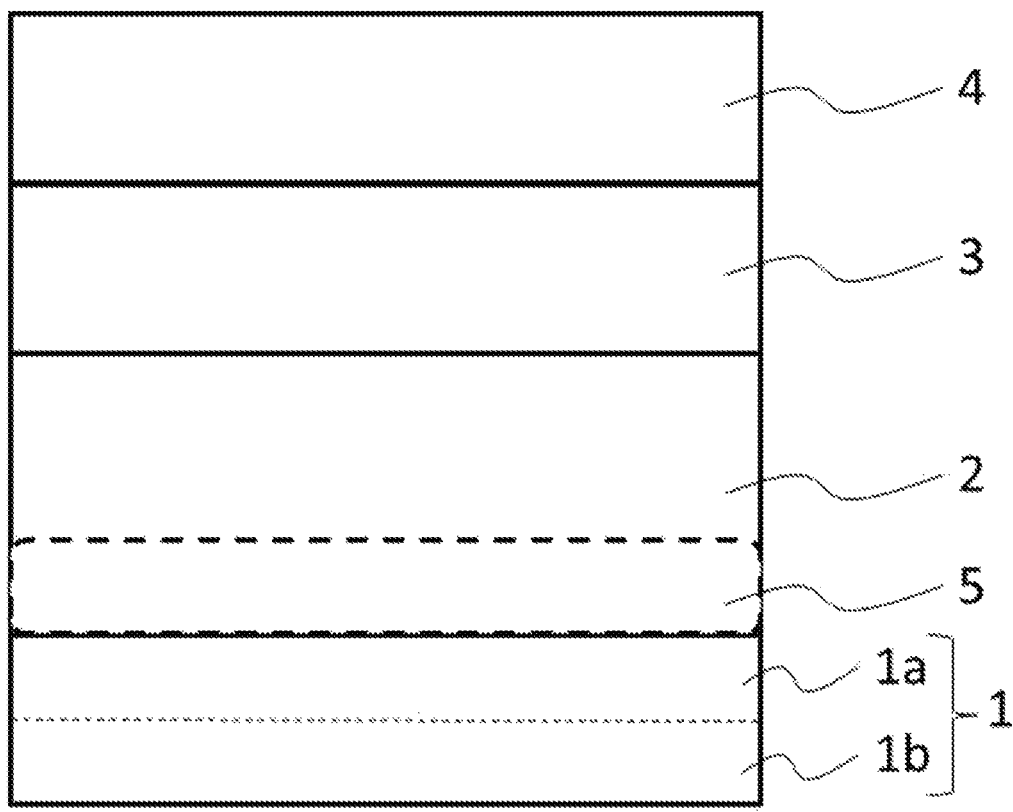
FIG. 7 shows a perspective view of the solar cell of the embodiment.

A second embodiment relates to a solar cell. FIG. 7 shows a sectional view of a solar cell 101 of the second embodiment. As shown in FIG. 2, the solar cell 100 according to the present embodiment has a p-electrode 1, a p-type light-absorbing layer 2, an n-type layer 3, and an n-electrode 4. The solar cell 101 is different from the solar cell 100 of the first embodiment in that the p-type light-absorbing layer 2 includes an oxide region 5 containing an oxide containing at least one element of Sn and Sb as well as Cu. Except the presence of the oxide region 5, the solar cell 100 of the first embodiment and the solar cell 101 of the second embodiment are common. An explanation on the commonality between the solar cell 100 of the first embodiment and the solar cell 101 of the second embodiment will be omitted.

The research by the inventors has found that the contact resistance between the p-electrode 1 (first p-electrode 1a) and the p-type light-absorbing layer 2 is reduced when the oxide region 5 containing an oxide of metal containing Cu and Sn, Cu and Sb, or Cu, Sn, and Sb is present on the p-electrode 1 side of the p-type light-absorbing layer 2.

From the viewpoint of reducing the contact resistance, the oxide region 5 is preferably present in the p-type light-absorbing layer up to the depth of 1000 nm (end point) towards the direction of the n-type layer 3 from the interface (origin point) between the p-type light-absorbing layer 2 and the first p-electrode 1a. From the same viewpoint, the oxide region 5 is preferably present up to the depth (end point) of 1000 nm towards the direction of the n-type layer 3 from the interface (origin point) between the p-type light-absorbing layer 2 and the first p-electrode 1a, and the depth (end point) of half the thickness of the p-type light-absorbing layer 2 towards the direction of the n-type layer 3 from the interface (origin point) between the p-type light-absorbing layer 2 and the first p-electrode 1a. From the same viewpoint, the oxide region 5 is more preferably present up to the depth of 100 nm (end point) towards the direction of the n-type layer 3 from the interface (origin point) between the p-type light-absorbing layer 2 and the first p-electrode 1a. In the region from the interface (origin point) between the p-type light-absorbing layer 2 and the first p-electrode 1a to the depth (end point) of 100 nm towards the direction of the n-type layer 3, it is preferable to contain Sn, Sb, or Sn and Sb overall.

From the viewpoint of reducing the contact resistance, the total volume concentration of Sn and Sb in the oxide region 5 is preferably equal to or more than $10^{15}$ atoms/cm$^3$. The region within the above range may include a region satisfying the total volume concentration of Sn and Sb. From the same viewpoint, the total volume concentration of Sn and Sb in the oxide region 5 is more preferably equal to or more than $10^{16}$ atoms/cm$^3$. If the total volume concentration of Sn and Sb in the oxide region 5 is too high, the crystallinity decreases and defects causing carrier recombination increase, which is not preferable. The Sb concentration in the oxide region 5 is preferably equal to or more than $10^{16}$ atoms/cm$^3$ and equal to or less than $10^{21}$ atoms/cm$^3$ in volume concentration, and more preferably equal to or more than $10^{16}$ atoms/cm$^3$ and equal to or less than $10^{19}$ atoms/cm$^3$. In the region from the interface (origin point) between the p-type light-absorbing layer 2 and the first p-electrode 1a to the depth (end point) of 100 nm towards the direction of the n-type layer 3, it is more preferable to satisfy the volume concentration overall.

If the Sn and Sb concentrations are high throughout the entire p-type light-absorbing layer 2, the mobility decreases with the increase in defects, and carrier recombination also increases. Therefore, in the region up to the depth (end point) of ⅓ of the thickness of the p-type light-absorbing layer 2 towards the p-electrode 1 from the interface (origin point) between the p-type light-absorbing layer 2 and the n-type layer 3, the total volume concentration of Sn and Sb in the oxide region 5 is preferably equal to or less than $10^{15}$ atoms/cm$^3$.

It is more preferable that the total volume concentration of Sn and Sb in the oxide region 5 decreases in an inclined manner towards the direction of the n-type layer 3 from the interface between the p-type light-absorbing layer 2 and the first p-electrode 1a. Specifically, it is as follows.

The region from the interface (origin point) between the p-type light-absorbing layer 2 and the first p-electrode 1a to the depth (end point) of 10 nm towards the direction of the n-type layer 3 is defined as a first oxide region. The total volume concentration of Sn and Sb in the first oxide region is denoted by $C_1$. $C_1$ is preferably equal to or less than $10^{21}$ atoms/cm$^3$. The average value of the total volume concentration of Sn and Sb in the first oxide region is denoted by $C_{1AVE}$. $C_{1AVE}$ is preferably equal to or less than $10^{21}$ atoms/cm$^3$. $C_1$ and $C_{1AVE}$ are preferably equal to or more than $10^{19}$ atoms/cm$^3$. When the total volume concentration of Sn and Sb is high in the first oxide region closest to the interface between the p-type light-absorbing layer 2 and the first p-electrode 1a, the contact resistance between the p-type light-absorbing layer 2 and the first p-electrode 1a is reduced. However, if the total volume concentration of Sn and Sb is too high in the first oxide region, the mobility decreases with an increase in defects, and carrier recombination also increases.

The region from the depth of 10 nm (origin point) towards the direction of the n-type layer 3 from the interface between the p-type light-absorbing layer 2 and the first p-electrode 1a to the depth of 30 nm (end point) towards the direction of the n-type layer 3 from the interface between the p-type light-absorbing layer 2 and the first p-electrode 1a is defined as a second oxide region. The total volume concentration of Sn and Sb in the second oxide region is denoted by $C_2$. $C_2$ is preferably equal to or less than $10^{20}$ atoms/cm$^3$. The average value of the total volume concentration of Sn and Sb in the second oxide region is denoted by $C_{2AVE}$. $C_{2AVE}$ is preferably equal to or less than $10^{20}$ atoms/cm$^3$. The first oxide region contributes to reduction of the contact resistance between the p-type light-absorbing layer 2 and the p-electrode, but the region located more on the n-type layer 3 side than the first oxide region does not contribute so much to reduction of the contact resistance. Hence, in the second oxide region onwards, if the total volume concentration of Sn and Sb is too high, the influence on the increase of defects becomes large. $C_{2AVE}$ and $C_{1AVE}$ preferably satisfy the relationship of $C_{2AVE}<C_{1AVE}$.

The region from the depth of 30 nm (origin point) towards the direction of the n-type layer 3 from the interface between the p-type light-absorbing layer 2 and the first p-electrode 1a to the depth of 100 nm (end point) towards the direction of the n-type layer 3 from the interface between the p-type light-absorbing layer 2 and the first p-electrode 1a is defined as a third oxide region. The total volume concentration of Sn and Sb in the third oxide region is denoted by $C_3$. $C_3$ is preferably equal to or less than $10^{19}$ atoms/cm$^3$. The average value of the total volume concentration of Sn and Sb in the third oxide region is denoted by $C_{3AVE}$. $C_{3AVE}$ is preferably equal to or less than $10^{19}$ atoms/cm$^3$. The first oxide region contributes to reduction of the contact resistance between the p-type light-absorbing layer 2 and the p-electrode, but the region located more on the n-type layer 3 side than the first oxide region does not contribute so much to reduction of the contact resistance. Hence, also in the third oxide region onwards, if the total volume concentration of Sn and Sb is too high, the influence on the increase of defects becomes large. $C_{3AVE}$ and $C_{2AVE}$ preferably satisfy the relationship of $C_{3AVE}<C_{2AVE}$.

The deeper one of the regions from the depth of 100 nm (origin point) towards the direction of the n-type layer 3 from the interface between the p-type light-absorbing layer 2 and the first p-electrode 1a to the depth of 1000 nm (end point) towards the direction of the n-type layer 3 or the depth (end point) of half the thickness of the p-type light-absorbing layer 2 towards the direction of the n-type layer 3 from the interface between the p-type light-absorbing layer 2 and the first p-electrode 1a is defined as a fourth oxide region. The total volume concentration of Sn and Sb in the fourth oxide region is denoted by $C_4$. $C_4$ is preferably equal to or less than $10^{17}$ atoms/cm$^3$. The average value of the total volume concentration of Sn and Sb in the fourth oxide region is denoted by $C_{4AVE}$. $C_{4AVE}$ is preferably equal to or less than $10^{19}$ atoms/cm$^3$. The first oxide region contributes to reduction of the contact resistance between the p-type light-absorbing layer 2 and the p-electrode, but the fourth oxide region does not contribute to reduction of the contact resistance. Hence, also in the fourth oxide region, if the total volume concentration of Sn and Sb is too high, the influence on the increase of defects becomes large. $C_{4AVE}$ and $C_{3AVE}$ preferably satisfy the relationship of $C_{4AVE}<C_{3AVE}$.

The interface between the p-type light-absorbing layer 2 and the first p-electrode 1a is assumed to be a place where the Sn concentration and the Cu concentration intersect in SIMS analysis. The interface between the p-type light-absorbing layer 2 and the n-type layer 3 is also determined by SIMS analysis. It is also possible to observe the interface from an SEM image, determine the thickness of each layer, and determine the position of the oxide region 5 together with the SIMS result.

One example of method for forming the p-type light-absorbing layer 2 of the solar cell 101 of the second embodiment will be described below. In the case where Cu and Sn are contained in the oxide region, for example, there is a method in which an oxide layer (Sn-doped $Cu_2O$) containing both Cu and Sn to become the oxide region 5 is deposited by sputtering in an atmosphere of oxygen, argon gas on the first p-electrode 1a, and then the p-type light-absorbing layer 2 is formed.

Third Embodiment

Figure 8:
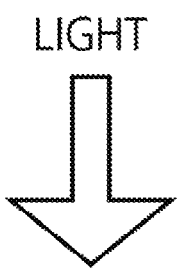
FIG. 8 shows a sectional view of the multi-junction solar cell of the embodiment.

A third embodiment relates to a multi-junction solar cell. FIG. 8 shows a conceptual sectional view of the multi-junction solar cell of the third embodiment. A multi-junction solar cell 200 of FIG. 8 has the solar cell (first solar cell) 100 (101) of the first embodiment on the light incident side and a second solar cell 201. The band gap of the p-type light-absorbing layer of the second solar cell 201 has a band gap smaller than that of the p-type light-absorbing layer 2 of the solar cell 100 of the first embodiment. The multi-junction solar cell of the embodiment includes a solar cell in which three or more solar cells are joined.

Since the band gap of the p-type light-absorbing layer 2 of the first solar cell 100 of the second embodiment is approximately 2.0 eV to 2.2 eV, the band gap of the light-absorbing layer of the second solar cell 200 is preferably equal to or more than 1.0 eV and equal to or less than 1.6 eV. The light-absorbing layer of the second solar cell is preferably one type selected from the group consisting of one or more types of compound semiconductor layers selected from the group consisting of CIGS and CdTe having a high In content ratio, crystalline silicon, and a perovskite compound.

Fourth Embodiment

Figure 9:
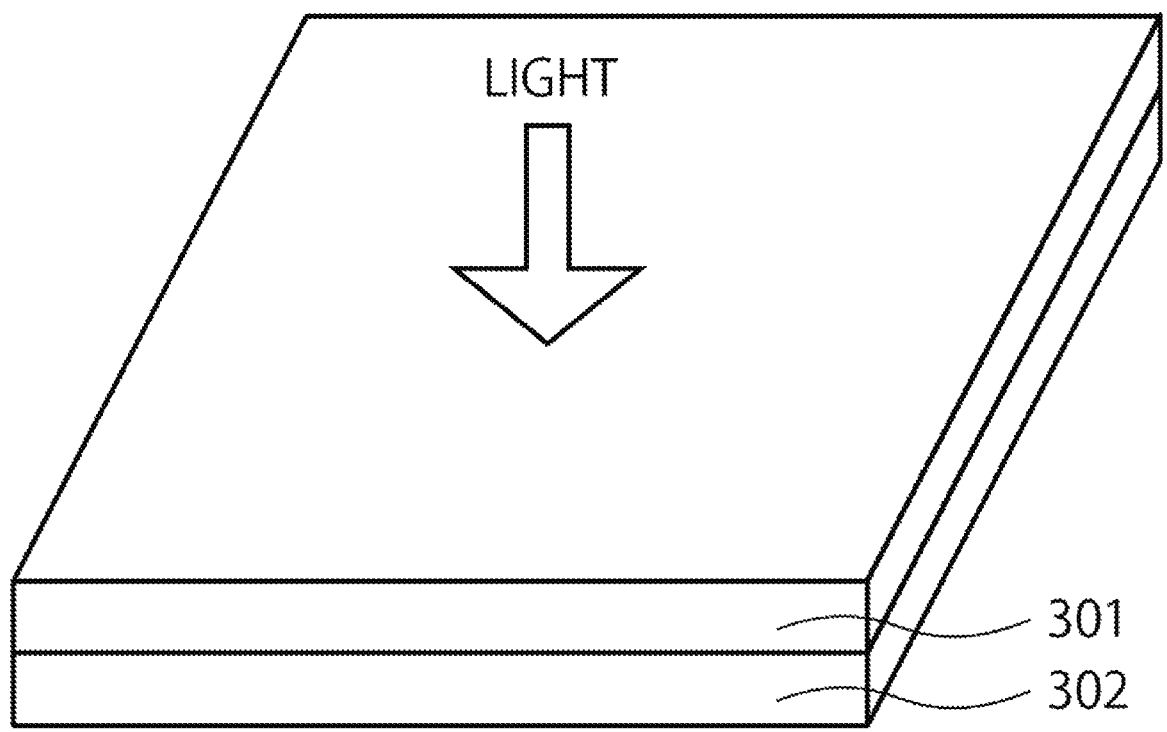
FIG. 9 shows a perspective view of the solar cell module of the embodiment.

A fourth embodiment relates to a solar cell module. FIG. 9 shows a perspective view of a solar cell module 300 of the fourth embodiment. The solar cell module 300 of FIG. 9 is a solar cell module in which a first solar cell module 301 and a second solar cell module 302 are laminated. The first solar cell module 301 is on the light incident side and uses the solar cell 100 of the first embodiment. It is preferable to use the second solar cell 201 for the second solar cell module 302.

Figure 10:
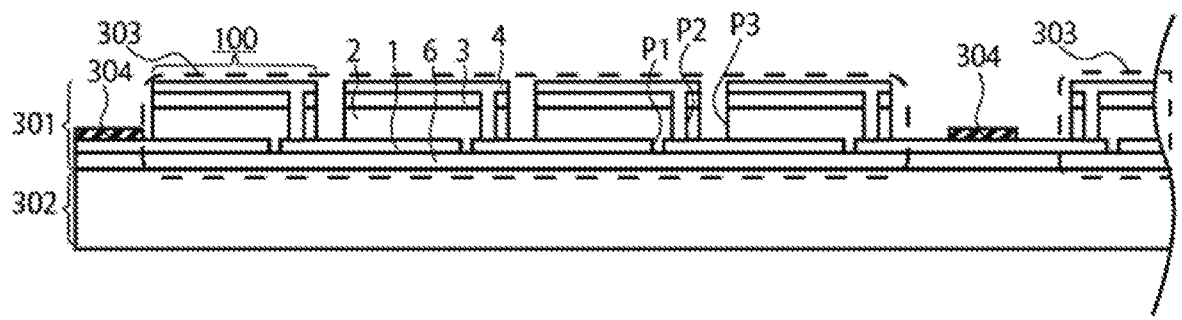
FIG. 10 shows a sectional view of the solar cell module of the embodiment.

FIG. 10 shows a sectional view of the solar cell module 300. FIG. 10 shows the structure of the first solar cell module 301 in detail and does not show the structure of the second solar cell module 302. In the second solar cell module 301, the structure of the solar cell module is appropriately selected according to the light-absorbing layer of the solar cell to be used. The solar cell module of FIG. 10 includes a plurality of sub-modules 303 surrounded by the dashed line in which a plurality of solar cells 100 are laterally disposed and electrically connected in series, and the sub-modules 303 are electrically connected in parallel or in series. The adjacent sub-modules 303 are electrically connected by bus bars 304.

The solar cells 100 are scribed, and the adjacent solar cells 100 are connected with the n-electrode 4 at the upper side and the p-electrode 1 at the lower side. Similarly to the solar cell 100 of the first embodiment, the solar cell 100 of the third embodiment has the p-electrode 1, the p-type light-absorbing layer 2, the n-type layer 3, and the n-electrode 4, and it has a substrate 6 between the p-electrode 1 and the second solar cell module 302. It is desirable to use white plate glass as the substrate 6, and it is also possible to use general glass such as quartz, soda lime glass, and chemically strengthened glass, or resin such as polyimide or acrylic. It is preferably configured so that both ends of the solar cell 100 in the sub-module 303 are connected with the bus bar 304 and the bus bar 304 electrically connects the sub-modules 303 in parallel or in series to adjust the output voltage with the second solar cell module 302.

Fifth Embodiment

Figure 11:
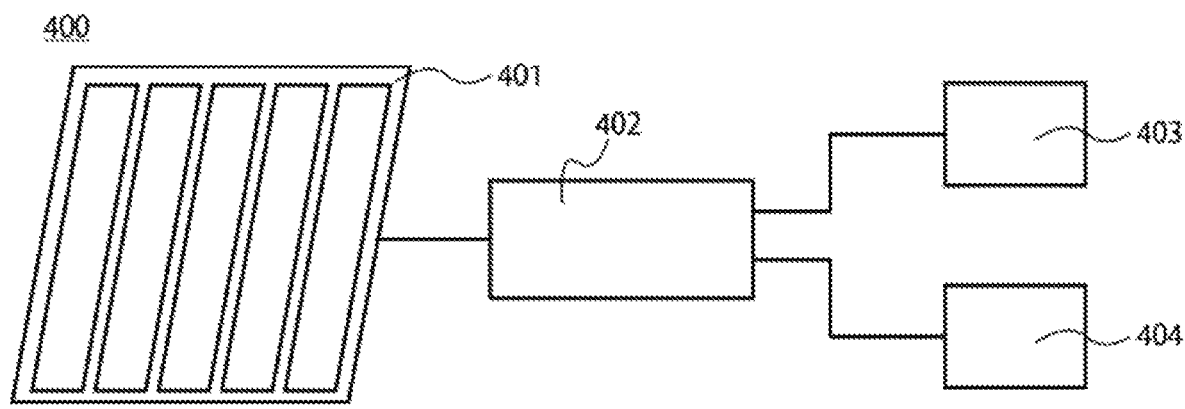
FIG. 11 shows a configuration diagram of the photovoltaic system of the embodiment.

A fifth embodiment relates to a photovoltaic power generation system. The solar cell module of the fifth embodiment can be used as a power generator that performs power generation in the photovoltaic power generation system of the fifth embodiment. The photovoltaic power generation system of the embodiment performs power generation using a solar cell module, and specifically includes a solar cell module that performs power generation, a unit that performs power conversion of generated electricity, and an electricity accumulating unit that stores the generated electricity or a load that consumes the generated electricity. FIG. 11 shows a conceptual configuration diagram of a photovoltaic power generation system 400 of the embodiment. The photovoltaic power generation system of FIG. 11 includes a solar cell module 401 (300), a converter 402, a storage battery 403, and a load 404. Either one of the storage battery 403 or the load 404 may be omitted. The load 404 may be configured to be able to utilize electric energy stored in the storage battery 403. The converter 402 is a device including a circuit or element that performs power conversion such as voltage transformation and DC/AC conversion, for example, a DC-DC converter, DC-AC converter, and AC-AC converter. A suitable configuration may be adopted for the converter 402 in accordance with a generated voltage, and configurations of the storage battery 403 and the load 404.

The solar cells included in the submodule 301 receiving light and included in the solar cell module 300 generate power, and the electric energy is converted by the converter 402 and stored in the storage battery 403 or consumed by the load 404. The solar cell module 401 is preferably provided with a sunlight tracking drive device for constantly directing the solar cell module 401 to the sun, a light collector for collecting sunlight, a device for improving power generation efficiency, and the like.

The photovoltaic power generation system 400 is preferably used for real estate such as a residence, a commercial facility, and a factory, and is used for a movable item such as a vehicle, an aircraft, and an electronic device. An increase in the amount of power generation is expected by using the photoelectric conversion element having excellent conversion efficiency of the embodiment, for the solar cell module 401.

Hereinafter, the present disclosure will be described more specifically on the basis of examples; however, the present disclosure is not limited to the following examples.

Example 1

The solar cell of Example 1 is an example of non light-transmissive solar cell opaque to visible light. On the glass substrate, an Al film is deposited on the side in contact with the glass as a lamination type p-electrode on the back side, and then an ATO (antimony-doped tin oxide) transparent conductive film is deposited on the Al. A $Cu_2O$ light-absorbing layer is formed on the opaque p-electrode by heating at 500° C. by sputtering in an oxygen, argon gas atmosphere. After that, a ZnGeO oxide is deposited as an n-type layer by sputtering at room temperature, and an AZO transparent conductive film is deposited as an n-electrode on the surface side.

By using an ATO transparent conductive film containing Sn as a main component for the p-electrode on the side in contact with the light-absorbing layer, a good ohmic contact with respect to a hole can be obtained with the light-absorbing layer, and the open circuit voltage and the fill factor are improved.

Comparative Example 1

The solar cell of Comparative Example 1 is an example of non light-transmissive solar cell opaque to visible light. On the glass substrate, an Al film is deposited on the side in contact with the glass as a lamination type p-electrode on the back side, and then an ITO transparent conductive film is deposited on the Al. The configuration is the same as that of Example 1 except for the p-electrode. Examining the power generation characteristics indicates that, compared with Example 1, the open circuit voltage was reduced to less than half and the fill factor was reduced to two thirds.

ITO is an oxide in which Sn:In=1:4 and the main component is In. Accordingly, it has been confirmed that in order to obtain a good p-contact with respect to $Cu_2O$, an oxide containing Sn as a main component is necessary as a p-electrode on the side in contact with $Cu_2O$.

Example 2

The solar cell of Example 2 is an example of light-transmissive solar cell opaque to visible light. On the glass substrate, an ITO transparent conductive film is deposited on the side in contact with the glass as a lamination type p-electrode on the back side, and then an ATO transparent conductive film is deposited on the ITO. A $Cu_2O$ light-absorbing layer is formed on the opaque p-electrode by heating at 500° C. by sputtering in an oxygen, argon gas atmosphere. After that, a ZnGeO oxide is deposited as an n-type layer by sputtering at room temperature, and an AZO transparent conductive film is deposited as an n-electrode on the surface side.

By using an ATO transparent conductive film containing Sn as a main component for the p-electrode on the side in contact with the light-absorbing layer, a good ohmic contact with respect to a hole can be obtained with the light-absorbing layer, and the open circuit voltage and the fill factor are improved.

Comparative Example 2

The solar cell of Comparative Example 2 is an example of light-transmissive solar cell opaque to visible light. On the glass substrate, an ITO transparent conductive film is deposited on the side in contact with the glass as a lamination type p-electrode on the back side, and then an AZO transparent conductive film is deposited on the ITO. The configuration is the same as that of Example 1 except for the p-electrode. Examining the power generation characteristics indicates that, compared with Example 1, the open circuit voltage was reduced to less than half and the fill factor was reduced to less than half.

AZO is an oxide and the main component is Zn. Accordingly, it has been confirmed that in order to obtain a good p-contact with respect to $Cu_2O$, an oxide containing Sn as a main component is necessary as a p-electrode on the side in contact with $Cu_2O$.

Example 3

The solar cell of Example 3 is an example of light-transmissive solar cell opaque to visible light. On the glass substrate, an ITO transparent conductive film is deposited on the side in contact with the glass as a lamination type p-electrode on the back side, and then an ATO transparent conductive film is deposited on the ITO. An oxide layer including Cu and Sb is formed on the opaque p-electrode by heating at 500° C. by sputtering in an oxygen, argon gas atmosphere, and a $Cu_2O$ light absorbing layer is formed on the oxide layer including Cu and Sb. After that, a ZnGeO oxide is deposited as an n-type layer by sputtering at room temperature, and an AZO transparent conductive film is deposited as an n-electrode on the surface side.

By using an ATO transparent conductive film containing Sn as a main component for the p-electrode on the side in contact with the light-absorbing layer, a good ohmic contact with respect to a hole can be obtained with the light-absorbing layer, and the open circuit voltage and the fill factor are more improved than that of examples 1 and 2.

Example 4

The solar cell of Example 4 is an example of light-transmissive solar cell opaque to visible light. On the glass substrate, an ITO transparent conductive film is deposited on the side in contact with the glass as a lamination type p-electrode on the back side, and then an NTO (Niobium doped Tin Oxide) transparent conductive film is deposited on the ITO. A $Cu_2O$ light-absorbing layer is formed on the opaque p-electrode by heating at 500° C. by sputtering in an oxygen, argon gas atmosphere. After that, a ZnGeO oxide is deposited as an n-type layer by sputtering at room temperature, and an AZO transparent conductive film is deposited as an n-electrode on the surface side.

By using an NTO transparent conductive film containing Sn as a main component for the p-electrode on the side in contact with the light-absorbing layer, a good ohmic contact with respect to a hole can be obtained with the light-absorbing layer, and the open circuit voltage and the fill factor are improved.

Example 5

The solar cell of Example 5 is an example of light-transmissive solar cell opaque to visible light. On the glass substrate, an AZO transparent conductive film is deposited on the side in contact with the glass as a lamination type p-electrode on the back side, and then an ATO transparent conductive film is deposited on the AZO. A $Cu_2O$ light-absorbing layer is formed on the opaque p-electrode by heating at 500° C. by sputtering in an oxygen, argon gas atmosphere. After that, a ZnGeO oxide is deposited as an n-type layer by sputtering at room temperature, and an AZO transparent conductive film is deposited as an n-electrode on the surface side.

By using an ATO transparent conductive film containing Sn as a main component for the p-electrode on the side in contact with the light-absorbing layer, a good ohmic contact with respect to a hole can be obtained with the light-absorbing layer, and the open circuit voltage and the fill factor are improved.

Example 6

The solar cell of Example 6 is an example of light-transmissive solar cell opaque to visible light. On the glass substrate, an hydrogen-doped indium oxide transparent conductive film is deposited on the side in contact with the glass as a lamination type p-electrode on the back side, and then an ATO transparent conductive film is deposited on the hydrogen-doped indium oxide. A $Cu_2O$ light-absorbing layer is formed on the opaque p-electrode by heating at 500° C. by sputtering in an oxygen, argon gas atmosphere. After that, a ZnGeO oxide is deposited as an n-type layer by sputtering at room temperature, and an AZO transparent conductive film is deposited as an n-electrode on the surface side.

By using an ATO transparent conductive film containing Sn as a main component for the p-electrode on the side in contact with the light-absorbing layer, a good ohmic contact with respect to a hole can be obtained with the light-absorbing layer, and the open circuit voltage and the fill factor are improved.

Example 7

The solar cell of Example 7 is an example of light-transmissive solar cell transparent to visible light. The p-electrode, the n-type layer, and the n-electrode are the same as those of Example 2, but the composition of the light-absorbing layer is different.

The light-absorbing layer of Example 7 is an oxide containing Ag in addition to Cu, and is formed on a transparent p-electrode by heating at 480° C. by sputtering in an oxygen, argon gas atmosphere.

An oxide containing Cu as a main component is used for the light-absorbing layer, and an ATO transparent conductive film containing Sn as a main component is used for the p-electrode on the side in contact with the light-absorbing layer, thereby obtaining a good ohmic contact with respect to a hole with the light-absorbing layer, and improving the open circuit voltage and the fill factor.

Example 8

The solar cell of Example 8 is an example in which the solar cell of Example 2 is used for the top cell of a multi-junction solar cell. The configuration of the top cell is the same as that of Example 2.

In order to configure a multi-junction solar cell, a single-crystal Si having a single-unit conversion efficiency of 22% was used for the bottom cell, and the top cell and the bottom cell were laminated and electrically connected in parallel. In order to match the output voltages of both, the number m of cells of the top cell and the number n of cells of the bottom cell are adjusted to satisfy the following expression, m×output V (top cell)=n×V (bottom cell).

Examining the solar cell characteristics indicates that by irradiating 1 sun of simulated sunlight, high characteristics of 11% of efficiency as the top cell alone and 29% of efficiency as the multi-junction solar cell were obtained.

In the description, some elements are denoted only by element symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell, comprising:
   a p-electrode in which a first p-electrode and a second p-electrode are laminated;
   a p-type light-absorbing layer in direct contact with the first p-electrode;
   an n-type layer in direct contact with the p-type light-absorbing layer; and
   an n-electrode, wherein:

the first p-electrode is disposed between the p-type light-absorbing layer and the second p-electrode, the p-type light-absorbing layer is disposed between the n-type layer and the first p-electrode, the n-type layer is disposed between the p-type light-absorbing layer and the n-electrode, the first p-electrode comprises a metal oxide containing Sn as a main component, a metal of the first p-electrode comprises at least Sn, Sb and Cu, the p-type light-absorbing layer is a semiconductor layer of a metal oxide containing Cu as a main component, and the metal oxide containing Cu as the main component is cuprous oxide or a composite oxide of cuprous oxide.

2. The solar cell according to claim 1, wherein the second p-electrode is a monolayer film or a laminated film selected from a group consisting of a metal film, an intermetallic compound film, and an oxide transparent conductive film, the metal film is a film which-comprises one or more types of metal selected from a group consisting of Cu, Al, Ag, Mo, W, and Ta, the intermetallic compound film is a film of intermetallic compound containing one or more types of the metal, and the oxide transparent conductive film is one or more types of film selected from a group consisting of indium tin oxide, aluminum-doped zinc oxide, boron-doped zinc oxide, gallium-doped zinc oxide, indium-doped zinc oxide, aluminum gallium oxide, titanium-doped indium oxide, indium gallium zinc oxide, and hydrogen-doped indium oxide.

3. The solar cell according to claim 1, wherein the second p-electrode has a light-transmissive property with respect to visible light.

4. The solar cell according to claim 1, wherein a thickness of the first p-electrode is equal to or more than 1 nm and equal to or less than 1000 nm.

5. The solar cell according to claim 1, wherein 90 atom % or more of the metal comprised in the first p-electrode is Sn.

6. The solar cell according to claim 1, wherein 95 atom % or more of the metal comprised by the metal oxide of the first p-electrode is Sn, and equal to or more than 0.1 atom % and equal to or less than 5 atom % of the metal comprised by the metal oxide of the first p-electrode comprises Cu and Sb.

7. The solar cell according to claim 1, wherein the p-type light-absorbing layer is an oxide layer represented by $Cu_a M_b O_c$, the M is one or more types selected from a group consisting of Sn, Sb, Ag, Li, Na, K, Cs, Rb, Al, Ga, In, Zn, Mg, and Ca, and the a, b, and c satisfy $1.80 \leq a \leq 2.01$, $0.00 \leq b \leq 0.20$, and $0.98 \leq c \leq 1.02$.

8. A multi-junction solar cell, comprising:

the solar cell according to claim 1; and another solar cell having a light-absorbing layer with a smaller band gap than that of the p-type light-absorbing layer of the solar cell according to claim 1.

9. A multi-junction solar cell, comprising:

the solar cell according to claim 1; and another solar cell having a p-type light-absorbing layer having a smaller band gap than that of a light-absorbing layer of the solar cell according to claim 1, wherein:

the p-type light-absorbing layer having a smaller band gap than that of the p-type light-absorbing layer of the solar cell according to the claim 1 comprises one type selected from a group comprising a compound semiconductor layer, a crystalline silicon, and a perovskite compound.

10. The solar cell according to claim 1, wherein the p-type light-absorbing layer is located on a light incident side of the solar cell.

11. The solar cell according to claim 1, wherein a metal of the metal oxide of the first p-electrode comprises Sn, Sb and Cu.

12. The solar cell according to claim 1, wherein the composite oxide of cuprous oxide includes Cu and one or more types of metal selected from the group consisting of Sn, Sb, Ag, Li, Na, K, Cs, Rb, Al, Ga, In, Zn, Mg, and Ca.

13. The solar cell according to claim 1, wherein Cu accounts for equal to or more than 60.0 atom % and equal to or less than 67.0 atom % in the metal oxide containing Cu as the main component, and oxygen accounts for equal to or more than 32.5 atom % and equal to or less than 34.0 atom % in the metal oxide containing Cu as the main component.

14. The solar cell according to claim 1, wherein an oxide region comprising an oxide of metal, that comprises Cu, Sn, and Sb, is present in the p-type light-absorbing layer up to a depth of 1000 nm towards a direction of the n-type layer from an interface between the p-type light-absorbing layer and the first p-electrode.

15. The solar cell according to claim 14, wherein a region in which a total volume concentration of Sn and Sb is equal to or more than $10^{15}$ atoms/cm$^3$ is present in the oxide region.

16. A solar cell module comprising the solar cell according to claim 1, and another solar cell having a p-type light-absorbing layer with a smaller band gap than that of a p-type light-absorbing layer of the solar cell according to claim 1.

17. A photovoltaic system comprising the solar cell module according to claim 16, wherein the photovoltaic system uses the solar cell module according to claim 16 to generate photovoltaic power.

18. A solar cell module comprising the solar cell according to claim 1.

19. A photovoltaic system comprising the solar cell module according to claim 18, wherein the photovoltaic system uses the solar cell module according to claim 18 to generate photovoltaic power.

* * * * *